United States Patent
Aki et al.

(10) Patent No.: US 7,034,319 B2
(45) Date of Patent: Apr. 25, 2006

(54) ELECTRON BEAM IRRADIATION APPARATUS, ELECTRON BEAM IRRADIATION METHOD, ORIGINAL DISK, STAMPER, AND RECORDING MEDIUM

(75) Inventors: Yuichi Aki, Tokyo (JP); Takao Kondo, Tokyo (JP); Minoru Takeda, Tokyo (JP); Masanobu Yamamoto, Kanagawa (JP); Shin Masuhara, Tokyo (JP); Toshiyuki Kashiwagi, Tokyo (JP)

(73) Assignee: Sony Corporation, Tokyo (JP)

( * ) Notice: Subject to any disclaimer, the term of this patent is extended or adjusted under 35 U.S.C. 154(b) by 114 days.

(21) Appl. No.: 09/789,943

(22) Filed: Feb. 28, 2001

(65) Prior Publication Data

US 2001/0052577 A1 Dec. 20, 2001

(30) Foreign Application Priority Data

Mar. 2, 2000 (JP) .......................... P2000-057374

(51) Int. Cl.
*C23F 1/00* (2006.01)
(52) U.S. Cl. .............................. 250/492.2; 250/492.3; 250/441.1; 216/24
(58) Field of Classification Search ............ 250/492.2, 250/310
See application file for complete search history.

(56) References Cited

U.S. PATENT DOCUMENTS

| | | | | |
|---|---|---|---|---|
| 3,939,302 A | * | 2/1976 | Kihara ..................... 178/6.6 R |
| 4,058,844 A | * | 11/1977 | Dirks ......................... 360/106 |
| 4,584,479 A | | 4/1986 | Lamattina et al. .......... 250/441 |
| 4,607,167 A | * | 8/1986 | Petric ....................... 250/492.2 |
| 4,837,443 A | * | 6/1989 | Young et al. .......... 250/440.11 |
| 5,825,037 A | * | 10/1998 | Nablo ..................... 250/492.3 |
| 5,858,587 A | * | 1/1999 | Yamane et al. ................ 430/22 |
| 6,062,241 A | * | 5/2000 | Tateyama et al. ........... 134/137 |
| 6,414,916 B1 | * | 7/2002 | Kojima ..................... 369/44.11 |
| 6,438,074 B1 | * | 8/2002 | Aki et al. ..................... 369/16 |
| 6,510,755 B1 | * | 1/2003 | Higuchi et al. .......... 74/490.09 |
| 6,590,633 B1 | * | 7/2003 | Nishi et al. .................... 355/53 |

FOREIGN PATENT DOCUMENTS

| | | |
|---|---|---|
| EP | 0312066 | 4/1989 |
| EP | 0324436 | 7/1989 |
| EP | 0384754 | 8/1990 |
| EP | 0936368 | 8/1999 |
| JP | 60066347 | 4/1985 |
| JP | 03012838 | 1/1991 |
| JP | 11288530 | 10/1999 |
| JP | 11288535 | 10/1999 |
| JP | 11328750 | 11/1999 |

\* cited by examiner

*Primary Examiner*—Nikita Wells
*Assistant Examiner*—Phillip A. Johnston
(74) *Attorney, Agent, or Firm*—Sonnenschein Nath & Rosenthal LLP

(57) ABSTRACT

An electron beam irradiation apparatus, includes a support section for supporting an electron beam irradiation subject to be irradiated with an electron beam, and an electron beam irradiation head opposed to the electron beam irradiation subject via a minute space, the electron beam irradiation head having an electron beam emission hole for irradiating the electron beam irradiation subject with the electron beam. In the electron beam irradiation head, an electron beam path communicating with the electron beam emission hole is provided, and in addition one or more ring shaped gas suction grooves opened from a surface of the electron beam irradiation head facing the electron beam irradiation subject is formed around the electron beam emission hole. Vacuum pumps are coupled to the electron beam path and the ring shaped gas suction grooves, and the electron beam path is held in a high vacuum state.

8 Claims, 4 Drawing Sheets

ELECTRON BEAM IRRADIATION APPARATUS, ELECTRON BEAM IRRADIATION METHOD, ORIGINAL DISK, STAMPER, AND RECORDING MEDIUM

RELATED APPLICATION DATA

The present application claims priority to Japanese Application No. P2000-057374 filed Mar. 2, 2000, which application is incorporated herein by reference to the extent permitted by law.

BACKGROUND OF THE INVENTION

1. Field of the Invention

The present invention relates to an electron beam irradiation apparatus, for example, an irradiation apparatus for electron beam lithography to be used for pattern irradiation of a resist with an electron beam, in original disc fabrication in the case where an optical recording medium, an optical magnetic recording medium, a phase change recording medium, a magnetic recording medium, or the like is formed by using the injection molding, 2P method (Photopolymerization method), or the like. The present invention also relates to an electron beam irradiation method, an original disc, a stamper, and a recording medium.

2. Description of the Related Art

In recent years, a much higher density is demanded for various information recording media such as optical disks, optical magnetic disks, and phase change disks. Fine formation of data recording pits and grooves such as track grooves on the recording media is demanded.

As a result, formation of a finer uneven pattern is demanded in fabrication of the above described original disk as well.

In the fabrication of such an original disc, a resist layer coated and formed on a substrate is subjected to pattern exposure of laser light. By development, a fine pattern is formed on the resist layer. For example, nickel plating is conducted thereon. A stamper having an inversion pattern of the fine pattern, or a master stamper or mother stamper for fabricating stampers is formed.

In such a method, by relative movement between a laser light spot and the substrate caused by rotation of, for example, the substrate along the substrate surface and for example, a unidirectional movement of the substrate along the substrate surface, the top of the resist layer is scanned with the spot in a spiral form or a concentric form. While scanning is thus being conducted, laser light is modulated by a recording signal. Thereby, exposure of a recording pattern is conducted.

In the case where such an exposure method using laser light is used, however, there is a restriction in spot diameter due to an optical limit caused by the laser wavelength and there occurs a problem in forming a sufficiently fine pattern.

On the other hand, in the case where an electron beam is used, a finer pattern can be implemented.

In the case where this electron beam exposure is used, however, work in a vacuum chamber is needed in order to prevent the electron beam from colliding with a gas molecule and being scattered thereby, and consequently the apparatus size becomes large. In addition, the structure is complicated by the above described substrate rotation, movement drive mechanism, signal wiring vacuum seal, and so on. An increase in the apparatus price is thus incurred. Consequently, a cost increase in, for example, the above described original disc, and a cost increase in, in its turn, the recording medium are incurred.

Against this, apparatuses capable of avoiding the use of such a large-scale vacuum chamber have been proposed in, for example, Japanese Patent Application Laid-Open Publication No. 11-288529 and Japanese Patent Application Laid-Open Publication No. 11-328750. In the proposed apparatuses, a diaphragm capable of transmitting an electron beam is provided in an electron optical barrel so as to be able to keep vacuum only inside of an electron beam column housing an electron gun, a condensor electron lens, deflection means, focus adjustment means, and so on therein. The electron beam is adapted to pass through a space in which helium is supplied only in a short beam path between the electron beam column and a disposition portion of a substrate having a resist layer. The disposition portion of the substrate, i.e., a rotation and movement mechanism portion of the substrate is disposed in the atmosphere. The portion held in the high vacuum state is thus reduced. The apparatus is thus reduced in size and made simpler.

SUMMARY OF THE INVENTION

In the case where the above described configuration in which a partial space is made vacuum by the diaphragm is used, a material which is easy to transmit an electron beam and a thickness are selected as to the diaphragm. The electron beam is scattered by the diaphragm and collision with gas molecules in a space reaching an electron beam exposure surface, i.e., the resist layer. Therefore, formation of a finer pattern is hampered.

The present invention provides an electron beam irradiation apparatus, an electron beam irradiation method, an original disc, a stamper, and a recording medium, whereby such scattering of the electron beam can be effectively avoided and provision of a large-scale vacuum chamber can be avoided.

In other words, in fabrication of the above described original disc, an electron beam irradiation apparatus, an original disc, a stamper, and a recording medium make possible formation of a fine pattern on the resist layer formed on the substrate, makes the apparatus simple, reduces the size of the apparatus, facilitates handling, improves the reliability, and reduces the cost.

DESCRIPTION OF THE PREFERRED EMBODIMENT

An electron beam irradiation apparatus according to the present invention includes a support section for supporting an electron beam irradiation subject to be irradiated with an electron beam, and an electron beam irradiation head opposed to the electron beam irradiation subject via a minute space, the head having an electron beam emission hole for irradiating the electron beam irradiation subject with an electron beam.

In the electron beam irradiation head, an electron beam path communicating with the electron beam emission hole is provided, and in addition at least one ring shaped gas suction groove opened from a surface of the electron beam irradiation head facing the electron beam irradiation subject is formed around the electron beam emission hole. Exhaust means, i.e., vacuum pumps are coupled to the electron beam path and the ring shaped gas suction groove(s), and the electron beam path is held in a high vacuum state.

In other words, in the present invention configuration, the electron beam path communicating with the electron beam emission hole for the electron beam irradiation subject is exhausted, and the electron beam path is held in a vacuum state. The ring shaped gas suction grooves are provided around the electron beam emission hole. And from here, gas in a minute space portion between the electron beam irradiation head and the electron beam irradiation subject, and especially gas existing near the electron beam emission hole is excluded. Owing to such a configuration, there is brought about an effect that gas entering the electron beam emission hole and gas existing in a space between the electron beam emission hole and the electron beam irradiation subject are effectively excluded.

In this way, the electron beam path in the electron beam irradiation head can be held in a high vacuum state. In addition, a flight path ranging from the electron beam emission hole to the electron beam irradiation subject can also be held in a high vacuum state.

Therefore, scattering of the electron beam caused by the diaphragm and scattering of the electron beam caused by collision with gas molecules during the flight of the electron beam can be effectively avoided.

Figure 1:
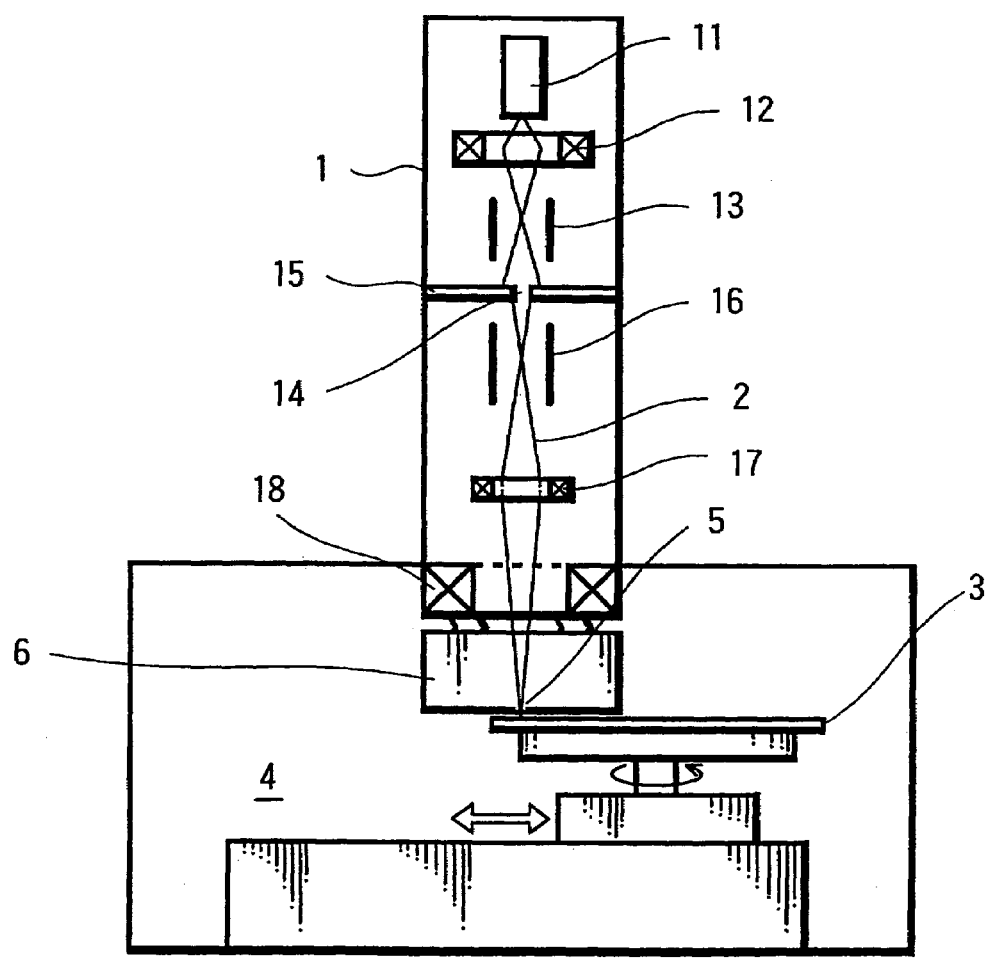
FIG. 1 is a schematic configuration diagram of an example of an electron beam irradiation apparatus according to the present invention.

FIG. 1 shows a schematic configuration diagram of an example of a mode for carrying out an electron beam irradiation apparatus according to the present invention.

The electron beam irradiation apparatus includes a so-called electron beam column 1, a support section 4 for supporting an electron beam irradiation subject 3 irradiated with an electron beam 2, and an electron beam irradiation head 6 facing the electron beam irradiation subject 3 via a minute space "d" and having an electron beam emission hole 5 for irradiating the electron beam irradiation subject 3 with the electron beam.

The electron beam column 1 includes, for example, an electron gun 11, a condenser electron lens 12 for converging an electron beam emitted from the electron gun 11, electron beam modulation means 13, a restriction plate 15 having an aperture 14 in its center, deflection means 16, focus adjustment means 17, and an object electron lens 18.

The electron beam modulation means 13 includes, for example, deflection electrode plates opposed to each other. The electron beam is deflected by applying a required voltage between the deflection electrode plates. The electron beam is thus transmitted through the aperture of the restriction plate 15 or intercepted by the restriction plate 15. In this way, on-off modulation is conducted.

Furthermore, the deflection means 16 conducts deflection for, for example, causing minute reciprocation of the electron beam, i.e., causing wobbling of the electron beam on the electron beam irradiation subject. This deflection means 16 is also formed of, for example, deflection electrode plates opposed to each other. Between these electrodes, a wobbling signal is inputted.

Furthermore, each of the focus adjustment means 17 and the object electron lens 18 is formed of, for example, an electromagnetic coil. By the focus adjustment means 17 and the object electron lens 18, the electron beam 2 is focused on the electron beam irradiation subject 3 through the electron beam irradiation head 6. In this case, the focus adjustment means 17 is supplied with, for example, a focusing servo signal.

Furthermore, the above described electron beam column 1 may have a graded degree of vacuum such that the degree of vacuum is made somewhat low on the electron beam emission side but the degree of vacuum is made high on the electron gun 11 side, as in columns used in, for example, scanning electron microscopes corresponding to low vacuum. In this case, electron beam irradiation can be conducted more stably.

Figure 2:
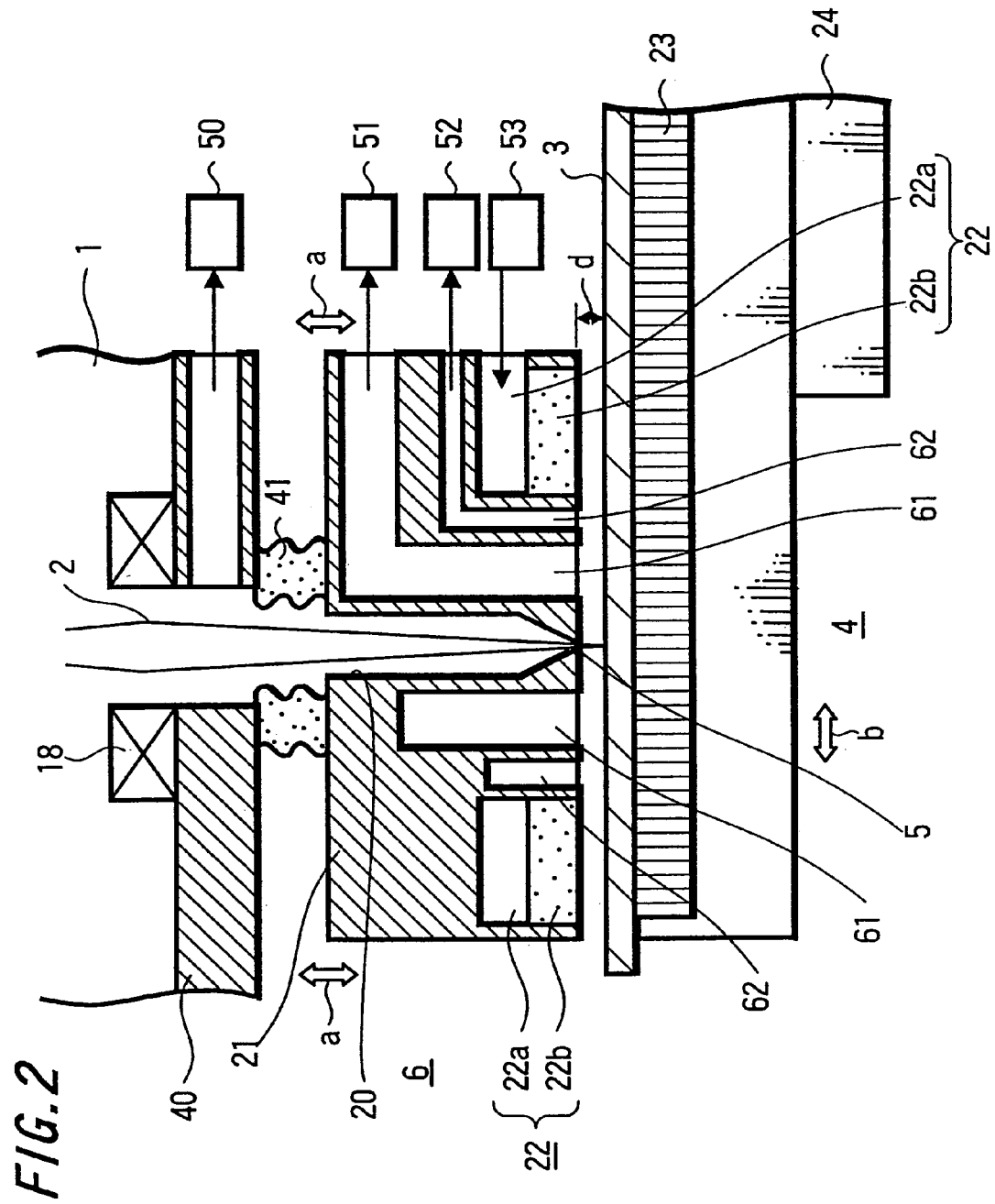
FIG. 2 is a schematic sectional view of a principal part of an example of an electron beam irradiation apparatus according to the present invention.
Figure 3:
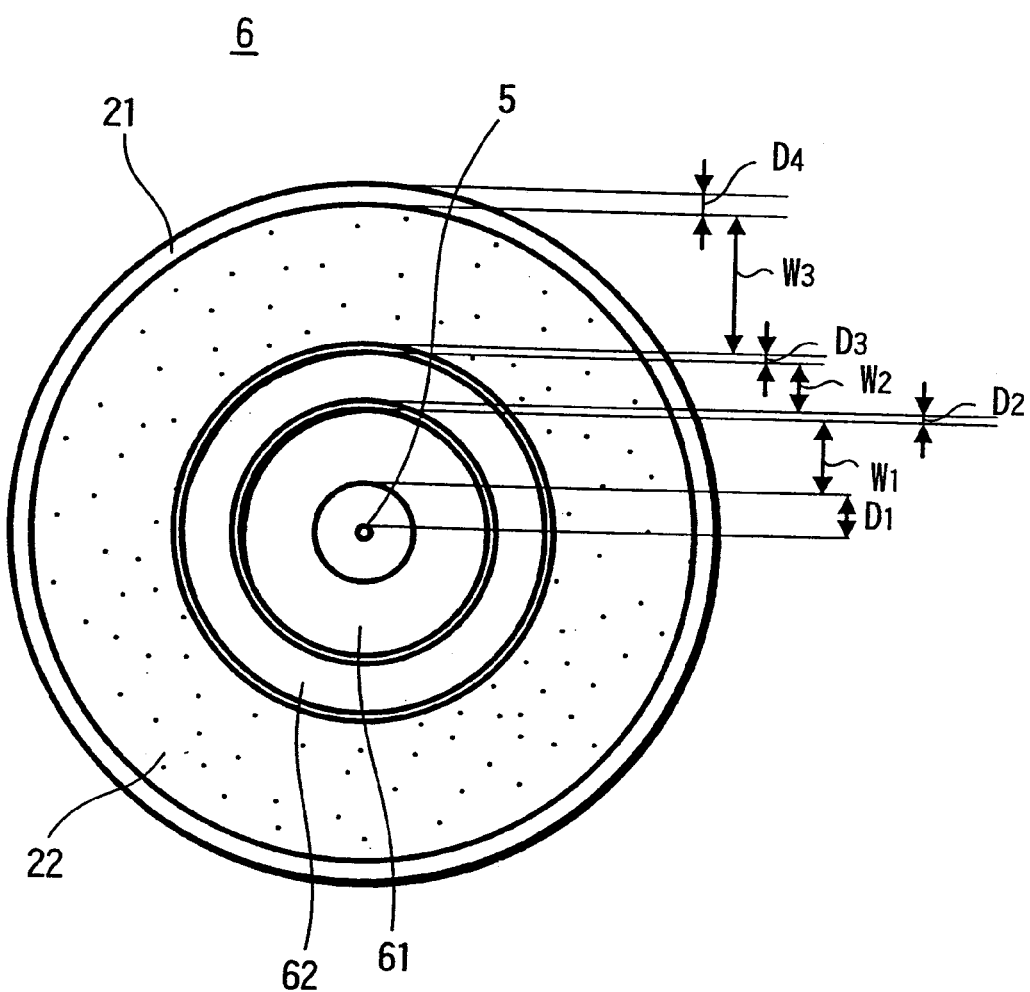
FIG. 3 is a bottom view of an electron beam irradiation head of an example of an electron beam irradiation apparatus according to the present invention.

As for the electron beam irradiation head 6, FIG. 2 shows a schematic sectional view of an example thereof and FIG. 3 shows its front view. As shown in FIGS. 2 and 3, the electron beam irradiation head 6 includes, for example, a block 21 made of, for example, ceramics or metal, having an electron beam path 20 communicating with the electron beam emission hole 5.

Furthermore, in the block 21, at least one ring-shaped gas suction grooves opened to a surface of the block 21 facing the electron beam irradiation subject 3 is formed around the electron beam emission hole 5. In the example of FIG. 2, first and second ring-shaped gas suction grooves 61 and 62 are formed concentrically around the electron beam emission hole 5.

And around the first and second ring-shaped gas suction grooves 61 and 62 of the block 21, static pressure flotation means 22, i.e., so-called static pressure bearing of the electron beam irradiation head 6 is provided.

The block 21, i.e., the electron beam irradiation head 6 is coupled to a stationary section 40 of the electron beam column 1 by expansion coupling means 41 such as bellows. By contraction and expansion of the expansion coupling means 41, the electron beam irradiation head 6 is held so as to be movable in an axis center direction indicated by an arrow "a".

Since the electron beam irradiation head 6 is made movable, a space between the electron beam irradiation head 6 and the electron beam irradiation subject 3 can be always kept at a constant space without depending upon, for example, thickness unevenness of the electron beam irradiation subject 3, by operation of the static flotation means 22 as described later.

In this case, inside of the expansion coupling means 41 is hermetically sealed. Through the inside of the expansion coupling means 41, the electron beam 2 from the electron beam column 1 arrives at the electron beam path 20 without being obstructed at all.

Exhaust means, i.e., a vacuum pump is coupled to each of, for example, the electron beam path 20 and the first and second gas suction grooves 61 and 62.

In this case, as the exhaust means 50 coupled to the electron beam path 20, exhaust means 50, such as a cryopump, a turbo-molecular pump or an ion sputter pump, having a vacuum capability of, for example, $10^{-8}$ [Pa] is used. The electron beam path 20 is brought into a vacuum state of approximately $1 \times 10^{-4}$ [Pa].

And a gas suction groove located closer to the center, i.e., the electron beam emission hole 5 is coupled to exhaust means capable of exhausting to attain a higher degree of vacuum. In other words, exhaust means 51 capable of attaining a degree of vacuum of, for example, approximately $1\times10^1$ [Pa] is coupled to the first gas suction groove 61, and exhaust means 52 capable of attaining a degree of vacuum of, for example, approximately $5\times10^3$ [Pa] is coupled to the second gas suction groove 62.

Furthermore, the static pressure flotation means 22, i.e., the static pressure bearing is formed in a ring shape, in a portion of the block facing the electron beam irradiation subject 3. For example, the static pressure flotation means 22, i.e., the static pressure bearing has opening in the surface of the block 21 facing the electron beam irradiation subject 3. The static pressure flotation means 22, i.e., the static pressure bearing is formed in a ring shape around the electron beam emission hole 5 so as to be located outside the outer gas suction groove which is in the illustrated example the second gas suction groove 62.

The static pressure flotation means, i.e., the static pressure bearing 22 includes a compressed gas path 22a having, for example, the above described ring shape, and a ventilation pad 22b so as to fill up the opening thereof.

A compressed gas supply source 53 is coupled to the ring shaped compressed gas path 22a to supply compressed gas with, for example, $5\times10^5$ [Pa]. As this gas, it is desirable to use, for example, nitrogen (N), or inert gas of light weight atoms of helium (He), neon (Ne), or argon (Ar). As described later, this gas does not enter the electron beam path 20. However, it is desirable that an electron emission cathode material of the electron gun 11 is not degraded even if an unforeseen accident occurs and the gas enters the electron beam path 20.

Furthermore, it is desirable that the ventilation pad 22b is a porous pad having a high load carrying capacity per static pressure bearing area and high rigidity.

Dimensions of various portions of the above described electron beam irradiation head 6 will now be exemplified. For example, the electron beam emission hole 5 has a diameter in the range of approximately 10 to 200 m. A distance D1 between the center of the electron beam emission hole 5 and the first ring shaped gas suction groove 61 is between approximately 2.5 mm and approximately 5 mm. The first ring shaped gas suction groove 61 has a width W1 in the range of approximately 4 to 5 mm. A distance D2 between the first and second ring shaped gas suction grooves 61 and 62 is approximately 2 mm. The second ring shaped gas suction groove 62 has a width W2 of approximately 2 mm. A distance D3 between the second ring shaped gas suction groove 62 and the static pressure flotation means 22 is approximately 2 mm. The static pressure flotation means 22 has a width W3 in the range of approximately 5 to 10 mm. A distance D4 between the static pressure flotation means 22 and the periphery surface of the block 21 is approximately 2 mm.

Although not illustrated, a gate valve for opening and closing the electron beam path can be provided, for example, near an end on the side of coupling with the electron beam column 1, or near an end of the electron beam irradiation head 6 on the side of coupling with the electron beam column 1.

On the other hand, the support section 4 of the electron beam irradiation subject 3 has turn table configuration having adsorption means 23 using, for example, a vacuum chuck or an electrostatic chuck.

The turn table is made rotatable around a center axis of a plate surface of the electron beam irradiation subject 3 by a spindle shaft 24. In addition, the turn table is made movable in a straight line direction along a plane perpendicular to the rotation center axis as indicated by an arrow "b". By the rotation and straight line movement, the irradiation surface of the electron beam irradiation subject 3 is moved with regard to the electron beam 2. The irradiation surface of the electron beam irradiation subject 3 can be scanned in a spiral form or a concentric form with the electron beam 2.

As drive means for causing the movement in the straight line direction, it is desirable to use an ultrasonic linear motor capable of being subjected to magnetic free drive, a voice coil motor of magnetic shield type, or the like in order to avoid the influence on the electron beam. Furthermore, as for this drive, it is desirable to conduct drive using feedback control from a linear scale having resolution of 10 nm or less.

Furthermore, it is desirable that the spindle shaft has such a configuration that the spindle shaft is received by the static pressure air bearing. In this way, smooth rotation is made possible and rotation (velocity) precision can be increased. Thus, the irradiation pattern precision of the electron beam 2 can be increased.

Furthermore, as for a drive motor of this spindle as well, it is desirable to adopt a direct rotation drive configuration using a brushless motor having a magnetically shielded drive section.

Figure 4A:
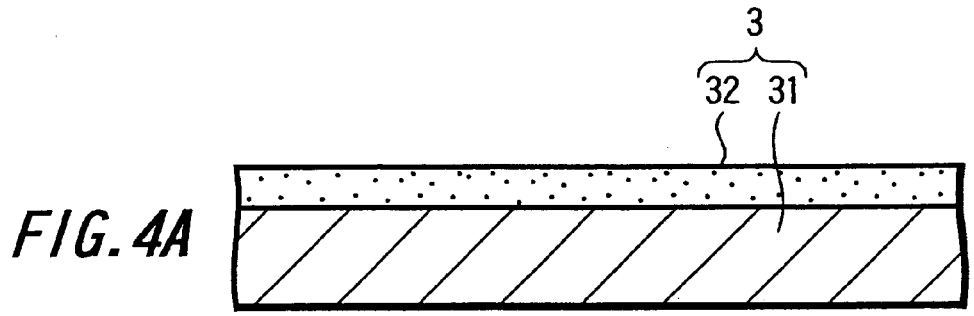
FIGS. 4A to D are fabrication process diagrams of fabrication of an original disc for recording medium fabrication using the present invention apparatus.
Figure 4B:
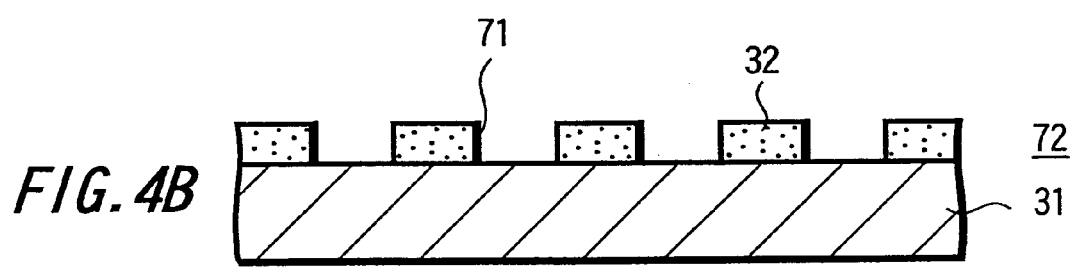

The electron beam irradiation subject 3 is formed by coating a resist layer 32 on a substrate 31 which is high in flatness as a whole and excellent in surface smoothness, for example, as shown in FIG. 4A. For example, in the case where an original disc for recording medium fabrication is formed, the photoresist layer 32 is formed on the substrate 31 such as a glass substrate, a quartz substrate, or a silicon wafer.

By pattern-irradiating the resist layer 32 with the electron beam 2, a latent image which can be implemented as a pattern by subsequent development on the resist layer 32 is formed.

Furthermore, in the present invention apparatus, the space "d" between the electron beam irradiation head 6 and the surface of the electron beam irradiation subject 3 (i.e., the electron beam irradiation surface) is made as small as, for example, approximately 5 μm.

The case where electron beam lithography is conducted on the electron beam irradiation subject 3 by using the above described present invention apparatus will now be described.

First of all, the electron beam irradiation subject is placed on the support section 4, i.e., the turn table, and adsorbed by the adsorption means 23.

In this state, the electron beam irradiation head 6 is brought closer to the electron beam irradiation surface of the electron beam irradiation subject 3, i.e., the coating surface of the resist. At this time, the static flotation means 22 is brought into its operation state, and gas is blown out from the ventilation pad 22b. In the first and second ring shaped gas suction grooves 61 and 62, however, the gas suction operation is not conducted. In this way, gas blown out from the static pressure flotation means 22 is blown against the electron beam irradiation surface of the electron beam irradiation subject 3. In such a state that collision or contact of the electron beam irradiation head 6 with the irradiation surface is avoided, therefore, the electron beam irradiation head 6 is brought closer to the electron beam irradiation surface of the electron beam irradiation subject 3 in such a coarse adjustment state that the space is made greater than the above described space "d", but is made close thereto.

In this state, the suction operation of the first and second ring shaped gas suction grooves 61 and 62, i.e., adjustment of vacuum evacuation is conducted. The space "d" is set to a predetermined narrow space such as 5 μm by differential operation between a positive gas pressure caused by the static pressure flotation means 22 and a negative pressure caused by the first and second ring shaped gas suction grooves 61 and 62.

And after the degree of vacuum of the ring shaped gas suction grooves 61 and 62 have risen to a predetermined value, the gate valve provided in the electron beam column 1 or the like is opened and the top surface of the electron beam irradiation subject 3 is irradiated with the electron beam 2 emitted from the electron beam emission hole 5.

And by conducting the rotation and straight line movement of the electron beam irradiation subject 3, the top surface of the electron beam irradiation subject 3, i.e., the resist layer is irradiated with the electron beam 2 so as to draw a spiral or circular locus. At this time, by applying a modulation signal depending upon the aimed irradiation pattern of the electron beam to the electron beam modulation means 13, the electron beam is turned on and off and the aimed irradiation pattern is formed in a spiral or circular form.

At this time, if the locus is to be wobbled, then desired electron beam wobbling can be conducted by applying a required wobbling signal to the above described deflection means 16.

At this time, in the present invention configuration, the electron beam path 20 communicating with the electron beam emission hole 5 for the electron beam irradiation subject 3 is evacuated by the evacuation means 50 so as to attain the vacuum state. On the other hand, gas is blown out from the static pressure flotation means 22. Since the ring shaped gas suction grooves 61 and 62 are formed between them, i.e., around the electron beam emission hole 5, however, this gas is sucked by the ring shaped gas suction grooves 61 and 62 and prevented from arriving at the electron beam emission hole 5.

In other words, a larger part of the gas supplied from the static pressure flotation means 22 is first absorbed by the second ring shaped gas suction groove 62. In addition, in the above described configuration, the gas is absorbed by the first ring shaped gas suction groove 61. And at this time, the space "d" between the electron beam irradiation head 6 and the electron beam irradiation subject 3 is small. Therefore, the ventilation conductance between the second ring shaped gas suction groove 62 and the first ring shaped gas suction groove 61 is small. In addition, by making the distance D1 between the first ring shaped gas suction groove 61 and the electron beam emission hole 5 as large as, for example, approximately 5 mm as described above as occasion demands and making the degree of vacuum of the first ring shaped gas suction groove 61 large, the conductance between the second ring shaped gas suction groove 62 and the electron beam emission hole 5 is made extremely small. As a result, leak of gas molecules into the electron beam emission hole 5 is almost avoided.

In this way, the electron beam path in the electron beam irradiation head 6 can be held in a high vacuum state. In addition, a flight path between the electron beam emission hole and the electron beam irradiation subject can be held in a high vacuum state.

The case where an original disc or a stamper for forming recording media having, for example, a fine uneven pattern by using the above described present invention apparatus and the injection molding or the 2P method will now be described by referring to FIG. 4. First of all, as shown in FIG. 4A, a substrate 31 which is high in flatness as a whole and excellent in surface smoothness is prepared. On the smooth surface of the substrate 31, a resist layer 32 is coated uniformly so as to attain a required thickness. The substrate 31 is formed of a substrate such as a glass substrate, a quartz substrate, or a silicon wafer. The resist layer 32 can be formed of, for example, a photoresist of positive type or negative type.

A pattern of the resist layer 32 corresponding to an aimed fine uneven pattern is subject to electron beam irradiation by using the above described present invention apparatus and the above described procedure. Thereafter, development processing is conducted and a portion irradiated with the electron beam or a portion which is not irradiated with the electron beam is removed to form a fine pattern 71 on the resist layer 32.

In this way, an original disc 72 having a fine uneven pattern formed of the fine pattern 71 of the resist layer 32 is obtained.

Figure 4C:
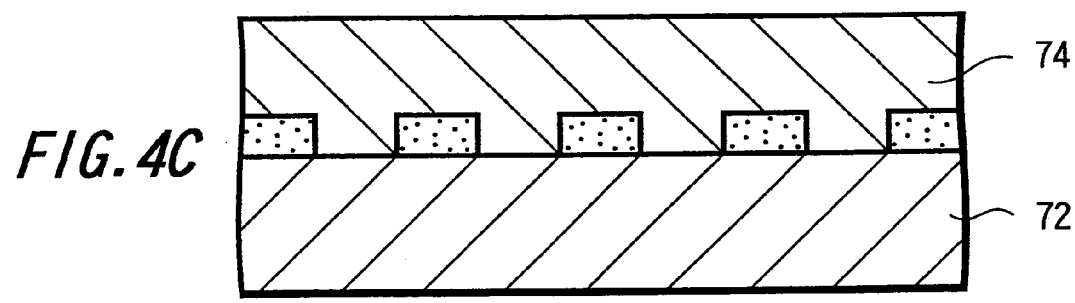
Figure 4D:
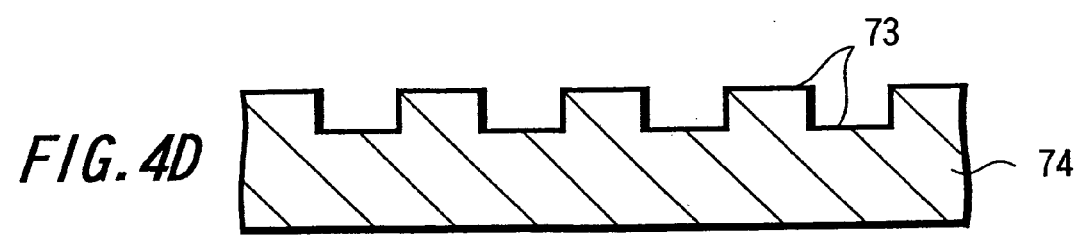

As shown in FIG. 4C, Ni plating or the like is conducted on the original disc 72. This is separated from the original disc 72, and a stamper 74 having a fine uneven pattern 73 is fabricated as shown in FIG. 4D. Although not illustrated, a recording medium having a fine uneven pattern is obtained thereby by using the injection molding, the 2P method or the like.

In the above described example, the case where a stamper is fabricated by transfer from the original disc is shown. However, it is also possible to fabricate a master stamper for fabricating a plurality of stampers by transfer and copying, and obtain a mother stamper for fabricating the master stamper by transfer.

Furthermore, in some cases, the substrate 31 is a substrate forming a recording medium itself. A patterned resist layer 32 is formed thereon by using the above described method. By using this as a mask, for example, RIE (reactive ion etching) may be conducted on the substrate to form a recording medium directly. In the same way, application to the case where a stamper, a master stamper, and a mother stamper are directly formed is also possible.

In the above described example of the present invention apparatus, the case where exhaust means 50 to 52 are provided is shown. However, common exhaust means may also be used. Furthermore, although not illustrated, the exhaust means provided in the electron beam column 1 may be used in common.

The present invention apparatus is not limited to the illustrated example, but various alterations can be conducted.

Furthermore, in the above described example, an electron beam irradiation apparatus used in the case where pattern irradiation is conducted on the resist with an electron beam has been mainly described. However, the present invention is not limited to this example, but can also be applied to various apparatuses having an electron beam irradiation apparatus, such as reflection scanning electron microscope.

In the present invention apparatus and method, an electron beam path 20 communicating with an electron beam emission hole 5 for the electron beam irradiation subject is exhausted, and the electron beam path is held in a vacuum state, as described above. Ring shaped gas suction grooves are provided around the electron beam emission hole 5. And from here, gas in a minute space portion between the electron beam irradiation head and the electron beam irradiation subject, and especially gas existing near the electron beam emission hole is excluded. Owing to such a configuration, gas entering the electron beam emission hole 5 and gas exiting from the electron beam emission hole 5 and existing in the current beam path, i.e., existing in a space between the electron beam emission hole and the electron beam irradiation subject can be effectively excluded.

Even in the case where the minute space between the electron beam irradiation head and the electron beam irradiation subject is held by static pressure flotation means using gas, without using a mechanical technique, i.e. without contact, the electron beam path 20 in the electron beam irradiation head 6 can be held in a high vacuum state. In addition, the flight path ranging from the electron beam emission hole to the electron beam irradiation subject can also be held in a high vacuum state.

In the present invention apparatus and method, therefore, scattering of the electron beam caused by the diaphragm and scattering of the electron beam caused by collision with gas molecules during the flight of the electron beam can be effectively avoided. Fine pattern irradiation with an electron beam can be conducted stably.

When the present invention apparatus is used as an electron beam lithography apparatus for fabricating an aimed product obtained by electron beam irradiation, such as the above described original disc, a stamper, or a recording medium, higher density recording, reduction of the cost for original disc fabrication, and consequent cost reduction of the recording medium can be attained.

Furthermore, in the present invention apparatus and method, it is not necessary to hold the vacuum state in a large space. Therefore, use of exhaust means of large size and high performance, i.e., vacuum pumps can be avoided. As a result, a simple, small-sized, inexpensive apparatus can be implemented.

Having described preferred embodiments of the present invention with reference to the accompanying drawings, it is to be understood that the present invention is not limited to the above-mentioned embodiments and that various changes and modifications can be effected therein by one skilled in the art without departing from the spirit or scope of the present invention as defined in the appended claims.

What is claimed is:

1. An electron beam irradiation apparatus comprising:
    a support section for supporting an electron beam irradiation subject to be irradiated with an electron beam;
    an electron beam irradiation head opposed to said electron beam irradiation subject and spaced from the subject by a minute space during operation of the apparatus, said electron beam irradiation head having:
        an electron beam emission hole allowing irradiation of said electron beam irradiation subject by the electron beam passing through the electron beam emission hole;
        a first ring-shaped gas suction groove and a second ring-shaped gas suction groove formed in a surface of said electron beam irradiation head facing said electron beam irradiation subject around the electron beam emission hole and around an electron beam path passing through the electron beam emission hole, and
        exhaust means coupled to said electron beam path and said ring-shaped gas suction grooves for holding said electron beam path in a high-vacuum state;
    a static pressure flotation configuration comprising static pressure means including an opening formed in the surface of said electron beam irradiation head and formed annularly around said ring-shaped gas suction grooves and said electron, beam emission hole, including a ventilation pad filling up the opening of the static pressure flotation means, and including a compressed gas path coupled to the opening of the static pressure flotation means; and
    driving means for rotating said electron beam irradiation subject around a center axis of a plate surface of said support section and moving in a straight line direction along a plane perpendicular to the rotation center axis, wherein:
    said ring-shaped gas suction grooves are disposed around said electron beam emission hole taken as a center with the first ring-shaped gas suction groove being closer to said emission hole than said second ring-shaped gas suction groove and the nearer a ring-shaped gas suction groove of said ring-shaped gas suction grooves is to said center, the higher a degree at which the respective ring-shaped gas suction groove is exhausted;
    W1>W2, where W1 is an opening width of said first ring-shaped gas suction groove and W2 is an opening width of said second ring-shaped gas suction groove;
    2.5 mm≦D1≦5 mm and D2<W1, where D1 is a distance between said first ring-shaped gas suction groove and said electron beam emission hole and D2 is a distance between said first ring-shaped gas suction groove and said second ring-shaped gas suction groove; and
    the minute space between said electron beam irradiation head and said electron beam irradiation subject is held by said static pressure flotation configuration during operation of the apparatus.

2. The electron beam irradiation apparatus according to claim 1, wherein said electron beam emission hole has a diameter between about 10 μm to about 200 μm.

3. The electron beam irradiation apparatus according to claim 1, wherein the minute space between said electron beam irradiation head and said electron beam irradiation subject is held by the static pressure flotation configuration using nitrogen or inert gas during operation of the apparatus.

4. The electron beam irradiation apparatus according to claim 1, wherein said electron beam irradiation subject is a substrate fabricated into an original disc when irradiated by the apparatus with a resist coat, a substrate fabricated into a stamper when irradiated by the apparatus with a resist coat, or a substrate fabricated into a recording medium when irradiated by the apparatus with a resist coat.

5. The electron beam irradiation apparatus according to claim 1, wherein said driving means for causing the movement in the straight line direction is an ultrasonic linear motor or a magnetic shield type voice coil motor.

6. The electron beam irradiation apparatus according to claim 5, wherein said driving means use feedback control including a linear scale having resolution of 10 nm or less.

7. The electron beam irradiation apparatus according to claim 1, wherein said driving means for rotating around the center axis of the plate surface of said electron beam irradiation subject is a direct rotation drive configuration using a brushless motor having a magnetically shielded drive section.

8. The electron beam irradiation apparatus according to claim 1, wherein the space between said electron beam irradiation head and the surface of said electron beam irradiation subject is approximately 51 μm.

* * * * *